United States Patent
Huang

(10) Patent No.: US 10,807,213 B2
(45) Date of Patent: Oct. 20, 2020

(54) CHEMICAL MECHANICAL POLISHING APPARATUS AND METHOD

(71) Applicant: Taiwan Semiconductor Manufacturing Co., Ltd., Hsinchu (TW)

(72) Inventor: Chun-Hsi Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/272,624

(22) Filed: Feb. 11, 2019

(65) Prior Publication Data

US 2020/0001425 A1 Jan. 2, 2020

Related U.S. Application Data

(60) Provisional application No. 62/692,264, filed on Jun. 29, 2018.

(51) Int. Cl.
| | | |
|---|---|---|
| *H01L 21/306* | (2006.01) | |
| *B24B 37/015* | (2012.01) | |
| *H01L 21/66* | (2006.01) | |
| *B24B 37/04* | (2012.01) | |

(52) U.S. Cl.
CPC .......... *B24B 37/015* (2013.01); *B24B 37/042* (2013.01); *H01L 21/30625* (2013.01); *H01L 22/26* (2013.01)

(58) Field of Classification Search
None
See application file for complete search history.

(56) References Cited

U.S. PATENT DOCUMENTS

| | | | |
|---|---|---|---|
| 7,335,088 B1 | 2/2008 | Hwang et al. | |
| 8,591,286 B2 | 11/2013 | Chen et al. | |
| 2005/0208880 A1* | 9/2005 | Saito | B24B 37/30 451/11 |
| 2010/0112901 A1* | 5/2010 | Togawa | B24B 37/013 451/5 |

FOREIGN PATENT DOCUMENTS

| | | |
|---|---|---|
| JP | 2003275948 A | 9/2003 |
| TW | 200831237 A | 8/2008 |
| TW | 201210739 A | 3/2012 |

* cited by examiner

*Primary Examiner* — Asok K Sarkar
(74) *Attorney, Agent, or Firm* — Sterne, Kessler, Goldstein & Fox P.L.L.C.

(57) ABSTRACT

The present disclosure describes a method and apparatus to adjust a wafer's polishing rate based on the temperature of the air received by the air chambers of a polishing head. The method includes supplying pressurized air to a temperature module coupled to a polishing head. The temperature module adjusts a temperature of the pressurized air that is supplied to the polishing head. The method further includes supplying the one or more air chambers of the polishing head with the temperature controlled pressurized air from the temperature module and polishing the wafer by rotating the wafer against a polishing pad.

20 Claims, 6 Drawing Sheets

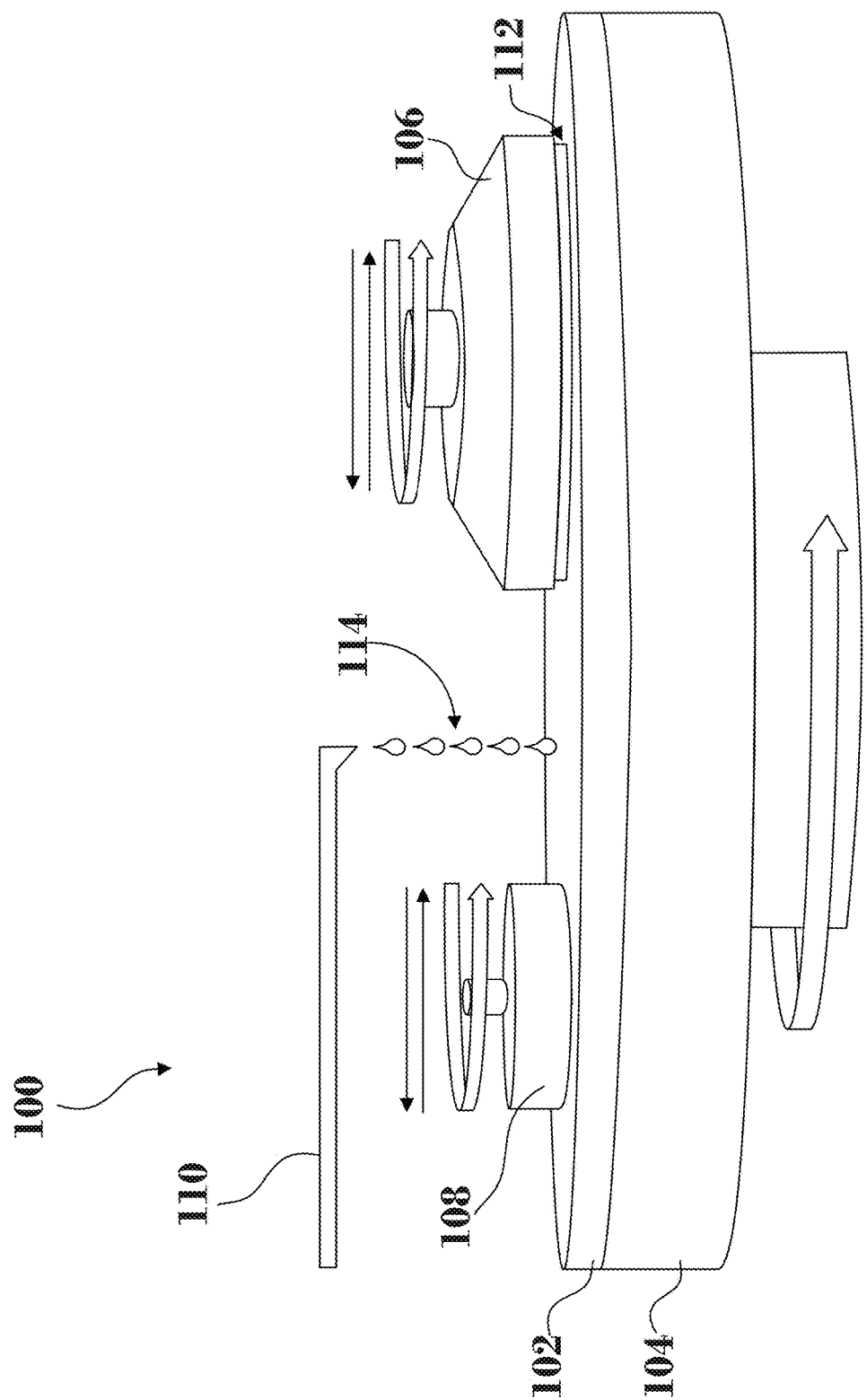

CHEMICAL MECHANICAL POLISHING APPARATUS AND METHOD

CROSS-REFERENCE TO RELATED APPLICATION

This application claims the benefit of U.S. Provisional Patent Application No. 62/692,264, titled "Novel Chemical Mechanical Polishing Apparatus and Method," which was filed on Jun. 29, 2018 and is incorporated herein by reference in its entirety.

BACKGROUND

A chemical mechanical planarization (CMP) process is a surface planarization technique that polishes and planarizes a wafer's surface by removing elevated features on the surface of the wafer relative to recessed features.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIG. 1 is a cross-sectional view of a polisher, according to some embodiments.

DETAILED DESCRIPTION

Figure 2A:
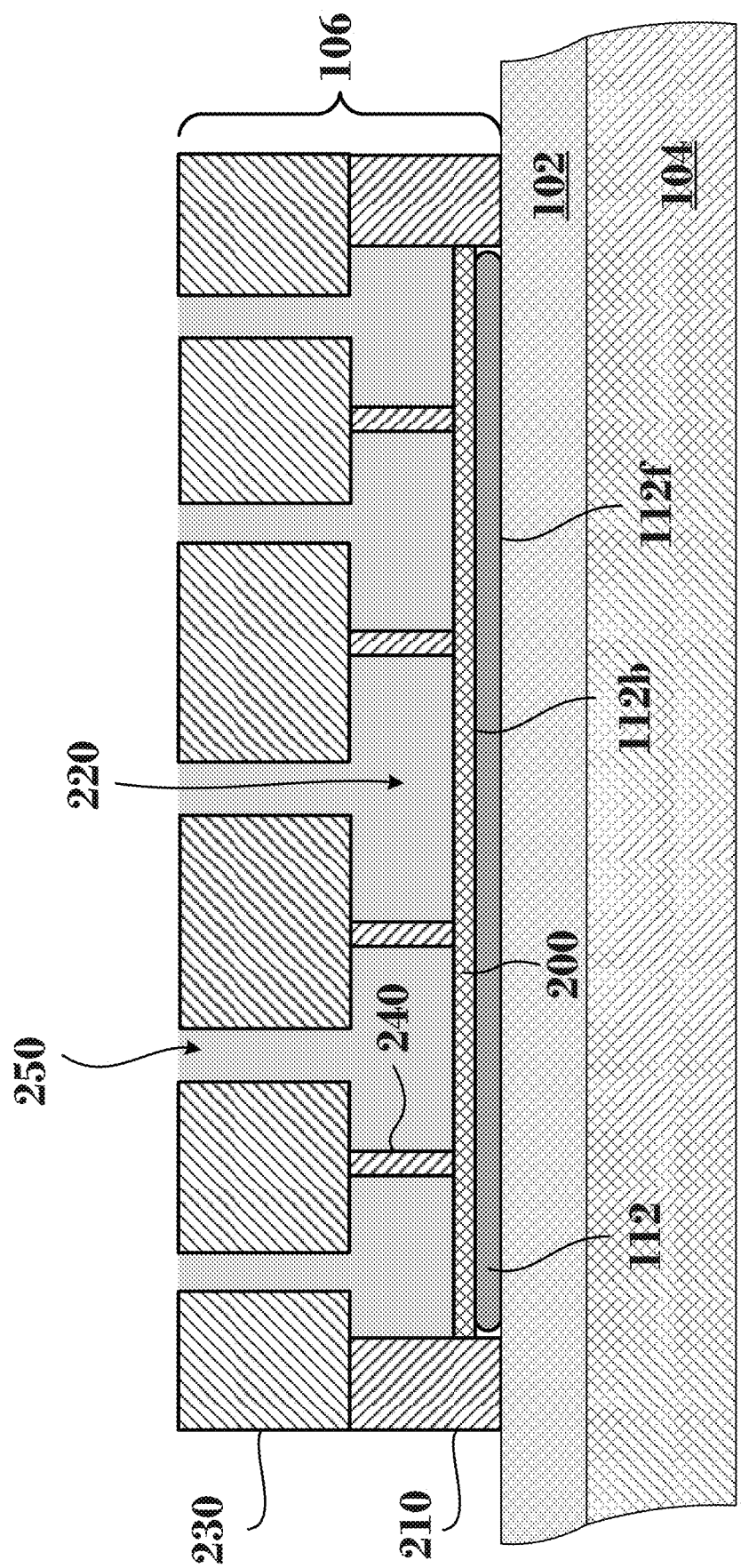
FIG. 2A is a cross-sectional view of a polishing head with one or more air chambers, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

The term "vertical," as used herein, means nominally perpendicular to the surface of a substrate.

Chemical mechanical planarization (CMP) is a global wafer surface planarization technique that planarizes the wafer's front surface (e.g., the surface on which additional layers and structures are formed during the fabrication process) by a relative motion between a wafer and a polishing pad in the presence of a slurry while applying pressure (downforce) to the wafer. The CMP module is referred to as a "polisher." In the polisher, the wafer is positioned face down on a wafer holder, or "polishing head," with its front surface held against a polishing pad, which is positioned on a flat surface referred to as a "platen." Polishers can use either a rotary or an orbital motion during the polishing process. CMP achieves wafer planarity by removing elevated features on the front surface of the wafer relative to recessed features. The slurry and the polishing pad are "consumables" because of their continual usage and need for replacement.

The slurry is a mixture of fine abrasive particles and chemicals that remove specific materials from the wafer's surface during the CMP process. Precise slurry mixing and consistent batch blends are critical for achieving wafer-to-wafer (WtW) and lot-to-lot (LtL) polishing repeatability (e.g., consistent polishing rate, consistent polish uniformity across the wafer and across the die, etc.). The quality of the slurry is important to avoid scratches or other defects on the surface of the wafer during the CMP process.

The polishing pad attaches to the top surface of the platen. The pad can be made, for example, from polyurethane due to polyurethane's mechanical characteristics and porosity. Further, the pad can feature small perforations to help transport the slurry along the wafer's front surface and promote uniform polishing. The pad also removes the reacted products away from the front surface of the wafer. As the pad polishes more wafers, the pad's surface becomes flat and smooth, causing a condition referred to as "glazing." Glazed pads cannot hold the polishing slurry-which significantly decreases the polishing rate on the wafer.

Polishing pads require regular conditioning to retard the effects of glazing. The purpose of conditioning is to extend the pad's lifetime and provide consistent polishing performance throughout its lifetime. Pads can be conditioned with mechanical abrasion or a deionized (DI) water jet spray that can agitate (activate) the pad's surface and increase its roughness. An alternative approach to activate the pad's surface is to use a conditioning wheel ("disk") featuring a bottom diamond surface that contacts the pad while it rotates. The conditioning process inevitably removes pad surface material and it is a significant factor in the pad's lifetime. Conditioning can be performed either in-situ (internal) or ex-situ (external) of the CMP module. In in-situ conditioning, the conditioning process is performed in real-time, where the pad conditioning wheel or disk is applied to one portion of the pad while the wafer polishing occurs on another portion of the pad. In ex-situ pad conditioning, the conditioning is not performed during polishing and can be performed after a predetermined number of wafers is polished. In either case, the polishing pad will have to be replaced. For example, 3000 or more wafers can be processed before the polishing pad is replaced.

As discussed above, the polishing head holds the wafer on the polishing pad during the CMP process. At the same time, the polishing head applies a pressure, or a downforce, to the back surface of the wafer. The downward force, along with the rotational motion of the polishing head relative to the platen, can affect the planarity of the wafer's front surface. A retaining ring secures the wafer on the polishing head during the polishing process. Further, a membrane (e.g., flexible membrane) is interposed between the polishing head and the back surface of the wafer as means to provide a uniform pressure or downforce to the wafer's back surface. The space between the polishing head and the membrane is filled with air to provide pressure to the back surface of the wafer. Depending on the design of the polishing head, the space between the polishing head and the membrane can be divided into two or more isolated air chambers that can be inflated independently and exert an equal or a different downforce to different regions of the wafer. The air chambers can be arranged concentrically over the wafer's back surface to form one or more "polishing zones" or "zones."

By way of example and not limitation, a polishing head can have 2 polishing zones (e.g., a first zone corresponding to a center region of the wafer and a second zone corresponding to an edge region of the wafer); 3 polishing zones (e.g., a first zone corresponding to a center region of the wafer, a second zone corresponding to a "donut" region of the wafer, and a third zone corresponding to an edge region of the wafer); 4 polishing zones (e.g., a first zone corresponding to a center region of the wafer, a second zone and a third zone corresponding to a donut region of the wafer, and a fourth zone corresponding to an edge region of the wafer); or more polishing zones. By controlling the pressure applied to each polishing zone, the polisher controls the downforce on each corresponding region of the wafer and, therefore, the removal rate on the front surface of the wafer. For example, if the layer to be removed on the front surface of the wafer is edge thick, a higher downforce can be applied to the wafer's edge compared to the wafer's center to ensure a uniform layer removal during the polishing process.

However, adjusting the pressure (e.g., downforce) in a polishing zone may pose limitations. For example, applying downforce to a region of the wafer to increase the removal rate in that region can induce mechanical stress that can be detrimental to the layers on the wafer, the integrity of the structures on the wafer, or to the wafer itself.

The present disclose is directed to a method and apparatus that applies temperature-controlled air in a polishing head to adjust polishing rate and improve a CMP process' uniformity. In some embodiments, the air temperature—in addition to the applied downforce—can provide improved polishing rate control. For example, decreasing the air temperature in a polishing zone can decrease the polishing rate (removal rate) at the polishing zone. Conversely, increasing the air temperature in a polishing zone can increase the polishing rate at the polishing zone. In some embodiments, each polishing zone in a polishing head is filled with temperature-controlled air having an equal or different temperature. In some embodiments, a temperature module can supply the polishing head with temperature-controlled air with a temperature between about −50° C. and about 130° C. By way of example and not limitation, the temperature module can be housed inside or outside the polishing tool.

FIG. 1 is an isometric view of components of a CMP polisher 100 ("polisher 100"), according to some embodiments. Polisher 100 includes a polishing pad 102, which is loaded onto a rotating platen (e.g., a rotating table) 104. Polisher 100 also includes a rotating polishing head 106, a rotating conditioning wheel (or "disk") 108, and a slurry feeder 110. For illustration purposes, FIG. 1 includes selected portions of polisher 100 and other portions (not shown) may be included. These other portions include, but are not limited to, chemical delivery lines, drain lines, control units, transfer modules, pumps, etc.

A wafer 112 to be polished is mounted at a bottom of polishing head 106 so that the wafer's front surface faces a top surface of polishing pad 102. Polishing head 106 rotates wafer 112 and applies a downforce so that wafer 112 is pressed against rotating polishing pad 102. Slurry 114, which includes chemicals and abrasive particles, is dispensed on the pad's surface. A combination of chemical reactions and mechanical abrasion between slurry 114, wafer 112, and polishing pad 102 results in material removal from the front surface of wafer 112. At the same time, conditioning wheel 108 agitates the top surface of polishing pad 102 to restore the pad's roughness. However, this is not limiting and conditioning wheel 108 can start conditioning polishing pad 102 after wafer 112 has been polished and removed from polisher 100.

In some embodiments, platen 104, polishing head 106, and conditioning wheel 108 rotate in the same direction (e.g., clockwise or counter clockwise) but with different angular speeds (e.g., rotating speeds). At the same time, polishing head 106 can swing between the center and the edge of polishing pad 102. On the other hand, conditioning wheel 108 may also swing between the center and the edge of polishing pad 102 or along a different path. In any case, the aforementioned relative movements of the various rotating components, such as conditioning wheel 108 and polishing head 106, are not limiting.

In some embodiments, the physical and mechanical properties of polishing pad 102 (e.g., roughness, material selection, porosity, stiffness, etc.) depend on the material to be removed from wafer 112. For example, copper polishing, copper barrier polishing, tungsten polishing, shallow trench isolation polishing, oxide polishing, or buff polishing require different types of polishing pads in terms of materials, porosity, and stiffness. The polishing pads used in a polisher (e.g., polisher 100) should exhibit rigidity to uniformly polish the wafer surface. Polishing pads (e.g., polishing pad 102) can be a stack of soft and hard materials that can conform to the local topography of wafer 112. By way of example and not limitation, polishing pad 102 can include porous polymeric materials with a pore size between about 1 and about 500 μm.

Polisher 100 can be part of a polishing tool (not shown in FIG. 1) that includes multiple polishers. Each polisher, within the polishing tool, can have the same, or different, type of polishing heads and polishing pads. The polishing tool can also include additional components, such as wafer handling equipment, wafer rinsing modules, gas delivery lines, wet chemistry delivery lines, electronic equipment, additional polishing heads and polishing pads, etc.

According to some embodiments, FIG. 2A is cross-sectional view of a polishing head 106 that holds wafer 112 against polishing pad 102 over platen 104. The wafer's front surface 112f faces the top surface of polishing pad 102, and the wafer's back surface 112b is positioned against a membrane 200 (e.g., a flexible membrane). During polishing, wafer 112 is secured in place via retention ring 210. In polishing head 106, a series of air chambers 220 are formed between walls 230, retention ring 210, and membrane 200 of polishing head 106. Air chambers 220 are separated from one another via separation walls 240. Pressurized air can enter the built-in air chambers 220 via inlets 250 at the top of polishing head 106.

Figure 2B:
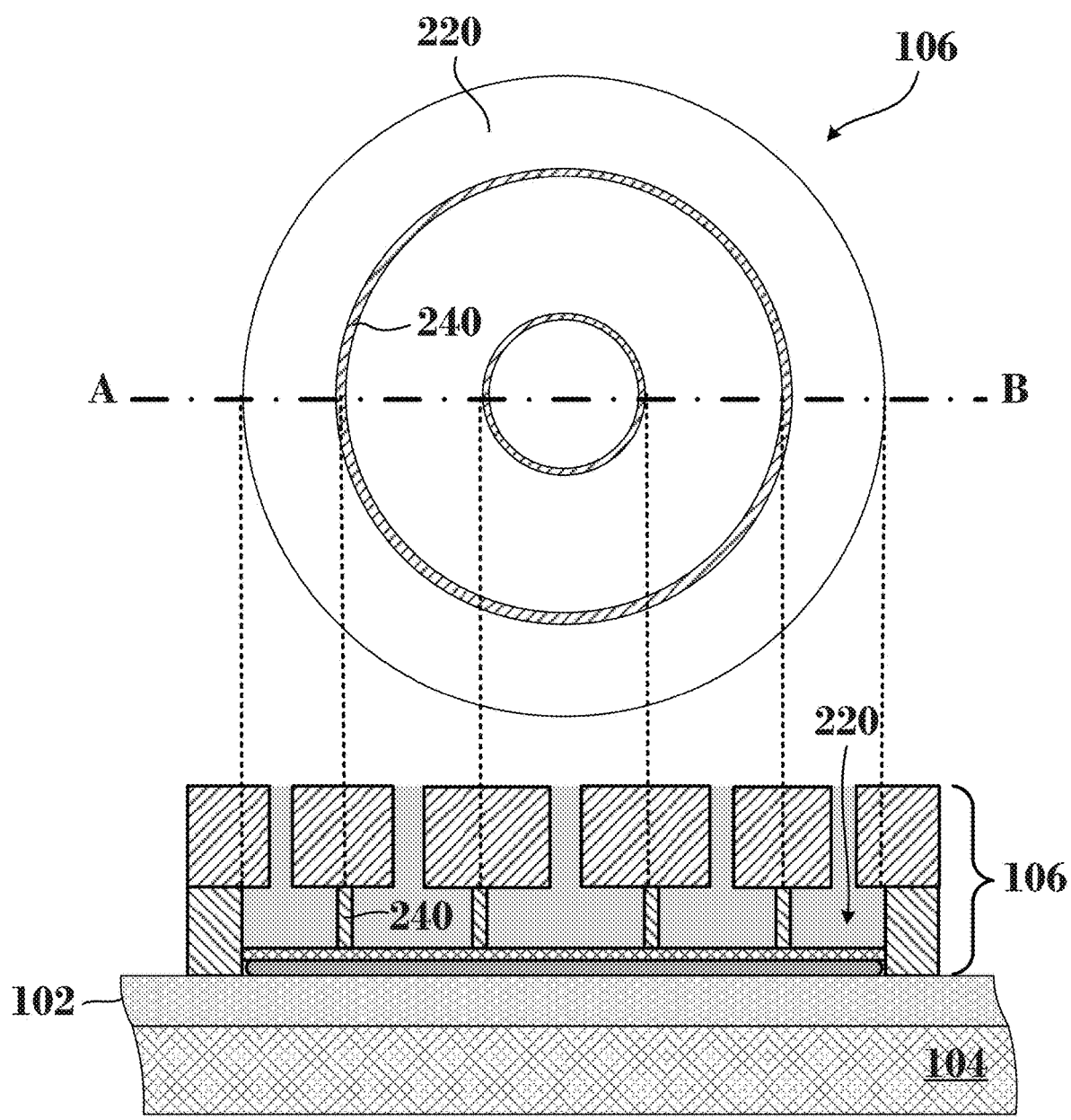
FIG. 2B is a plan-view and a cross-sectional view of a polishing head with one or more air chambers, according to some embodiments.

In some embodiments, air chambers 220 are air channels concentrically arranged between a center and an edge of polishing head 106 to form one or more polishing zones, as shown in FIG. 2B which includes a top-view of polishing head 106 over the cross-sectional view of polishing head 106 from FIG. 2A. For example, the cross-sectional view of polishing head 106 in FIG. 2A is the cross section of polishing head 106 in FIG. 2B along line AB. In some embodiments, a single air chamber 220 may correspond to a single polishing zone. Alternatively, a group of air chambers 220 may correspond to a single polishing zone. Air chambers 220 can be pressurized with air to exert a downforce via membrane 200 to wafer 112 to control the polishing rate for each polishing zone. The illustration of air chambers 220 in FIG. 2A is not limiting. Thus, alternative arrangements are possible with fewer or additional air chambers 220 having a different layout than the one shown in FIG. 2A. For example, different types of polishing heads can have a different number of air chambers 220 and a different number of polishing zones. According to some embodiments, air chambers 220 are equipped with pressure sensors configured to provide a pressure feedback, which is used to determine the downforce exerted to back surface 112b of wafer 112.

By way of example and not limitation, air from a facility air-supply unit can be distributed to active polishing heads via a network of gas lines within the polishing tool. Further, one or more air flow controllers in the polishing tool can control the air flow between the air chambers in the polishing head. In some embodiments, the air chambers are filled with air (e.g., pressurized) or evacuated to achieve the desired downforce on the wafer. In some embodiments, a temperature module is interposed between the facility air-supply unit and the polishing tool. For example, and referring to FIG. 3, facility air-supply unit 300 supplies pressurized air to temperature module 320 via gas line 330. Temperature module 320 supplies temperature-controlled air to polishing tool 340 via gas lines 320H and 320C. Polishing tool 340 can include one or more polishers (e.g., polisher 100 shown in FIG. 1) with each polisher including a polishing head 106. By way of example and not limitation, air having a first temperature (e.g., between about 24° C. and about 130° C.) from temperature module 320 can be delivered to polishing tool 340 through gas line 320H and air having a second temperature (e.g., between about −50° C. and about 24° C.) can be delivered to polishing tool 340 through gas line 320C. A network of gas lines (not shown in FIG. 3), can distribute the air from gas line 320H and the air from gas line 320C to inlets 250 of polishing heads 106. In some embodiments, gas lines 320H and 320C can feed each inlet 250, or groups of inlets 250, independently. In other words, the temperature in each air chamber 220 can be independently controlled via a network of gas lines (not shown in FIG. 3). The air distribution can be controlled based on a desired polishing rate for each polishing zone of each polishing head 106. The air temperature in each air chamber (e.g., air chambers 220 shown in FIG. 2A), along with the pressure inside the air chamber, can be controlled independently and determine the polishing rate for the respective polishing zone.

In some embodiments, due to a heat conduction between the air in each air chamber and the underlying wafer, different regions of the wafer can be cooled or heated. Because of the heat exchange process, the wafer's polishing rate can be modulated across the wafer. For example, and assuming a substantially equal downforce across the wafer, heated regions of a wafer can exhibit higher polishing rates compared to cooled regions of the wafer. It is therefore possible to control the polishing rate of a wafer without changing the applied pressure. Independently heating or cooling respective regions of a wafer provides another way (in addition to pressure) to control the wafer's polishing rate. For example, adjusting the wafer's polishing rate based on temperature can be used to control polishing wafer areas with challenging surface topographies, such as at the perimeter, the center, or the donut region of the wafer. Additionally, the polishing rate adjustment based on temperature control can be used when adjustments based on pressure are not available due to possible damage to layers on the wafer, possible damage to structures formed on the wafer, possible damage to the wafer itself, or combinations thereof.

Figure 3:
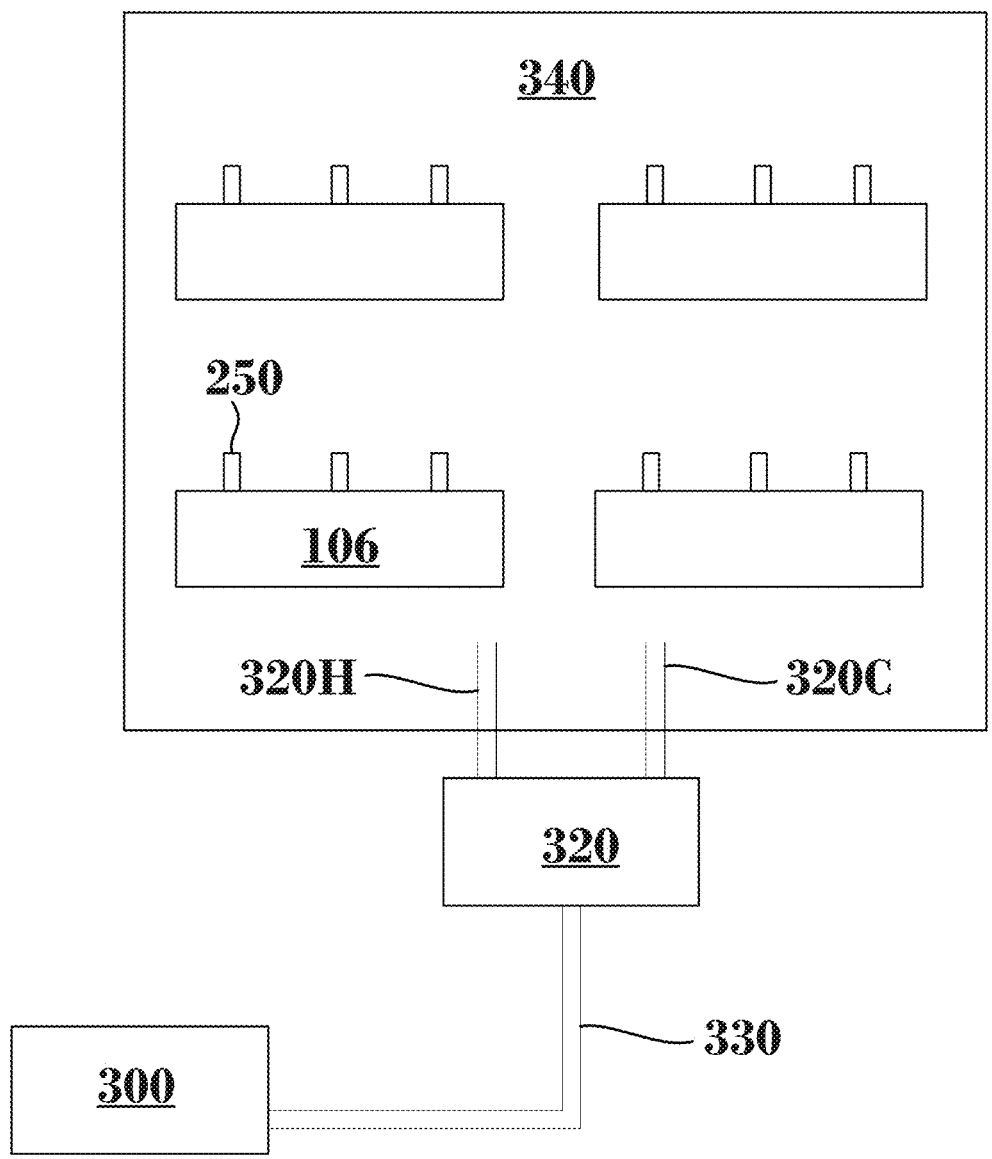
FIG. 3 is a polishing system with a temperature module housed outside a polishing tool, according to some embodiments.

In referring to FIGS. 2A, 2B, and 3, temperature module 320 can modulate the temperature of the air supplied to polishing tool 340, and subsequently to the one or more air chambers 220 of each polishing head 106. In some embodiments, the air supplied by facility air-supply unit 300 is at about 24° C. (e.g., between about 23° C. and about 25° C.; at room temperature). According to some embodiments, temperature module 320 is configured to provide temperature-controlled air to polishing tool 340 between about −50° C. and about 130° C. (e.g., between about −50° C. and about −20° C., between about −30° C. and about 0° C., between about −10° C. and about 24° C., between about 20° C. and about 80° C., between about 50° C. and about 100° C., between about 70° C. and about 130° C.). The aforementioned temperature range is not limiting, however, air temperatures below −50° C. or above 130° C. may induce thermal stress to the wafer (e.g., thermal stress that can shatter the wafer). The temperature-controlled air is channeled to one or more air chambers 220 of one or more polishing heads 106 via corresponding inlets 250. Thus, air chambers 220 of a polishing head 106 can be pressurized with air having a temperature between about −50° C. and about 130° C., according to some embodiments. Depending on the desired polishing rate at each polishing zone, individual air chambers 220 are filled with heated air (e.g., between about 24° C. and about 130° C.) or cooled air (e.g., between about −50° C. and about 24° C.) from temperature module 320 via inlets 250. In some embodiments, polishing heads 106 can include temperature sensors that monitor the temperature of the temperature-controlled air received by air chambers 220 and provide feedback to polishing tool 340. In some embodiments, polishing tool 340 can use the measurement from the temperature sensors to adjust the air pressure in one or more air chambers 220, adjust the temperature of the air received by one or more air chambers 220, or both.

Figure 4:
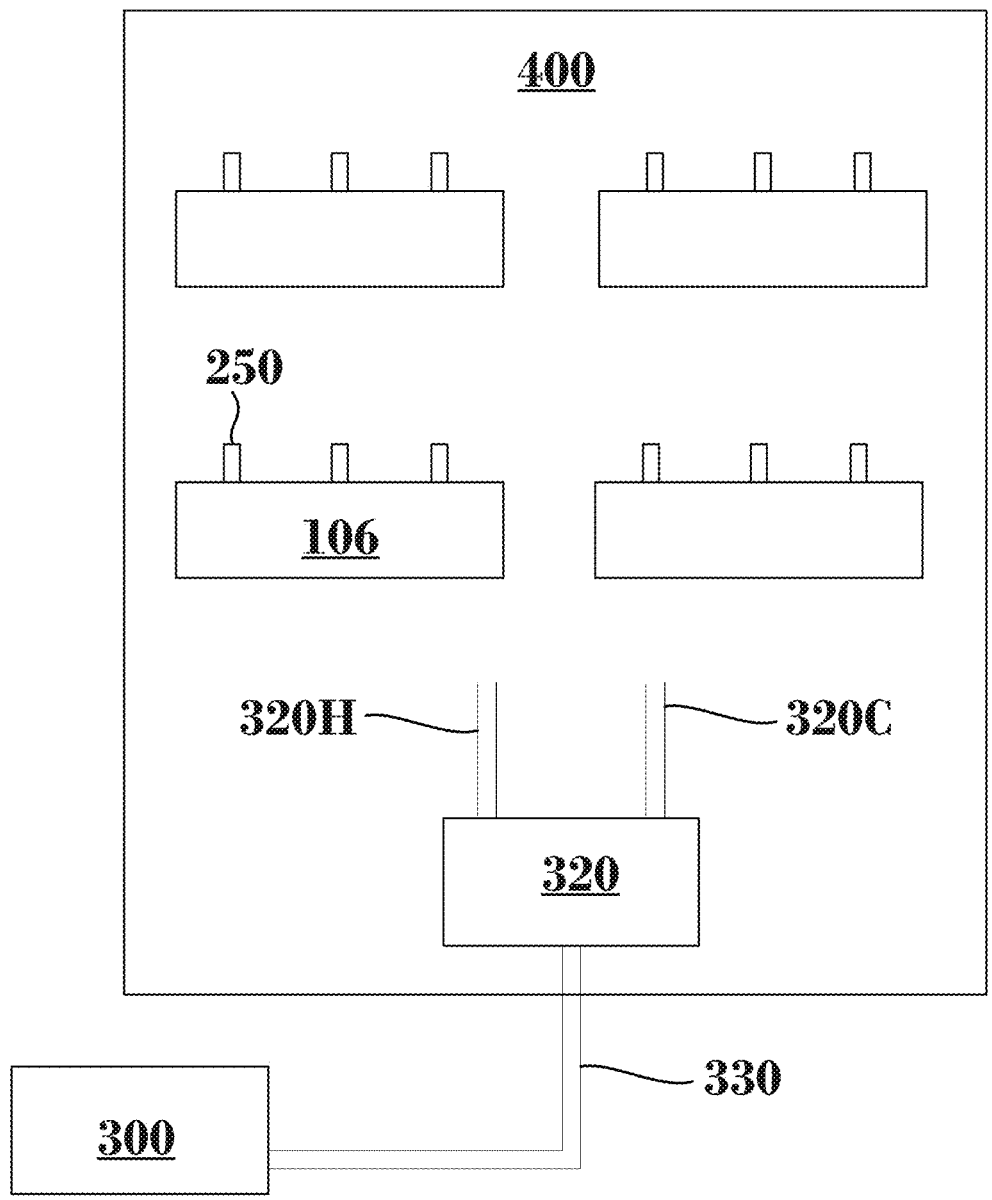
FIG. 4 is a polishing system with a temperature module housed inside the polishing tool, according to some embodiments.

By way of example and not limitation, temperature module 320 can be a vortex tube, an air cooler, or an air heater configured to provide temperature-controlled air within a temperature range between about −50° C. and about 130° C. In some embodiments, one or more temperature modules (e.g., temperature module 320 of FIG. 3) are connected to polishing tool 340. For example, a single temperature module 320 can be dedicated to one or more inlets 250 of polishing head 106. If a polishing zone includes two or more air chambers 220, a single temperature module 320 may be dedicated to each polishing zone of a polishing head 106. Further, as shown in the example of FIG. 3, temperature module 320 can be housed outside polishing tool 340. For example, temperature module 320 can be a standalone module. However, this is not limiting, and temperature module 320 can be housed inside polishing tool 340, as shown in FIG. 4.

Figure 5:
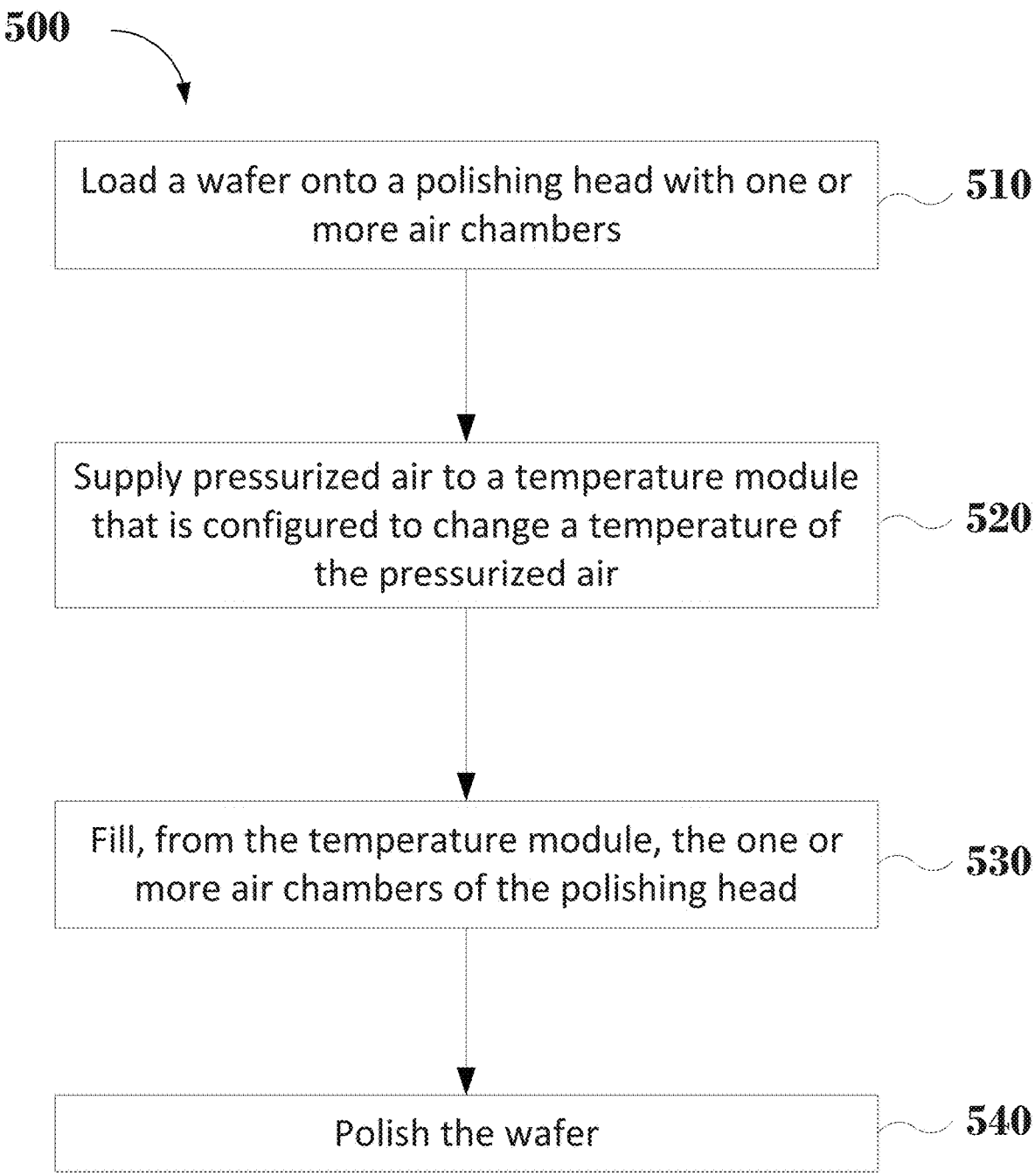
FIG. 5 is a flow chart of a polishing method that uses temperature-controlled air in a polishing head to adjust a polishing rate on a wafer, according to some embodiments.

FIG. 5 is a method 500 for polishing wafers using a polishing head with air chambers filled with temperature-controlled air, according to some embodiments. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 5. In some implementations, one or more other operations may be performed in addition to or in place of the presently described operations. For illustration purposes, method 500 is described with reference to the embodiments of FIGS. 1-4. However, method 500 is not limited to these embodiments.

Method 500 begins with operation 510, where a wafer is loaded onto a polishing head with one or more air chambers. For example, and referring to FIG. 2A, wafer 112 can be loaded onto polishing head 106 and placed so that front surface 112f (e.g., wafer surface to be polished) of wafer 112 faces polishing pad 102. Back surface 112b of wafer 112 is placed against membrane 200. As shown in FIG. 2A, polishing head 106 includes one or more air chambers 220 that can be filled with pressurized air via inlets 250. When air fills the air chambers 220, the resulting pressure exerts a downforce to backside back surface 112b of wafer 112 through membrane 200. In some embodiments, a single air chamber or a group of air chambers correspond to a single polishing zone. The polishing zones of polishing head 106 can have an equal or different pressure setting and can collectively cover back surface 112b of wafer 112. By way of example and not limitation, the number of polishing zones and their locations can vary depending on the design of polishing head 106. In some embodiments, polishing head 106 is part of polisher 100, which includes additional components. Further polisher 100 can be part of a polishing tool (e.g., polishing tools 340 and 400 shown in FIGS. 3 and 4, respectively).

In referring FIG. 5, method 500 continues with operation 520, where pressurized air is supplied to a temperature module configured to adjust the pressurized air temperature. In some embodiments, the pressurized air supplied to the temperature module originates from a facility air-supply unit (e.g., facility air-supply unit 300 shown in FIGS. 3 and 4). The temperature of the pressurized air from the facility air-supply unit can be about 24° C. (e.g., at room temperature). In some embodiments, the temperature module is configured to adjust the temperature of the incoming pressurized air. Further, the temperature module is configured to supply pressurized air with a first temperature (e.g., between about 24° C. and about 130° C.; may also be referred to as "heated pressurized air") or a second temperature (e.g., between about −50° C. and about 24° C.; may be also referred to as "cooled pressurized air") to polishing heads 106. For example, referring to FIG. 3, temperature module 320 can supply the heated pressurized air to polishing tool 340 via gas line 320H and supply the cooled pressurized air to polishing tool 340 via gas line 320C. By way of example and not limitation, a network of gas lines (not shown in FIG. 3) can distribute the heated pressurized air from gas line 320H and cooled pressurized air from gas line 320C to individual or grouped inlets 250 of polishing heads 106 in polishing tool 340.

In referring FIG. 5, method 500 continues with operation 530, where the one or more air chambers 220 are filled with temperature-controlled air supplied by temperature module 320. In some embodiments, regions of the wafer below each respective air chamber 220 are cooled or heated (due to the cooled or heated pressurized air, respectively) because of the heat exchange between the temperature-controlled air in the air chambers and the wafer. As a result, the polishing rate of the materials on the wafer can be modulated. For example, under equal downforce conditions, high wafer temperatures (e.g., between about 24° C. and about 130° C.) can increase the polishing rate of the materials on the polished wafer surface, and lower wafer temperatures (e.g., between about −50° C. and about 24° C.) can decrease the polishing rate of the materials on the polished wafer surface. However, the polishing rate dependency on wafer temperature can be different for different materials. For example, for a given wafer temperature change, the polishing rate change of a low-k dielectric (e.g., carbon-doped silicon oxide) can be less than the polishing rate change of silicon oxide. Regardless of the material to be polished, the polishing rate in a polishing zone can be controlled via the pressure and/or the air temperature in the air chambers of the polishing head, according to some embodiments.

In referring to FIG. 5, method 500 continues with operation 540 and the wafer polishing operation. As discussed above, an appropriate combination of temperature and/or pressure in each polishing zone of the polishing head can provide improved polishing uniformity across the wafer. Temperature-controlled air can be used to adjust the polishing rate for one or more polishing zones with or without the need to adjust the polishing pressure in a polishing head.

The present disclosure is directed to a method and apparatus to adjust a polishing rate based on temperature-controlled air received by air chambers of a polishing head. In some embodiments, the air temperature in a polishing zone—in addition to the applied polishing pressure can further tune the wafer's polishing rate for the polishing zone. For example, decreasing the air temperature in a polishing zone can decrease the polishing rate or removal rate of that polishing zone. Conversely, increasing the air temperature in a polishing zone can increase the polishing rate of that polishing zone. In some embodiments, the polishing zone of a polishing head is filled with temperature-controlled air that can vary in temperature. As a result, the polishing rate for each polishing zone can be different under the same polishing pressure. In some embodiments, the air temperature in a polishing zone can range from about −50° C. to about 130° C. According to some embodiments, the wafer's polishing rate can be fine-tuned for a given polishing pressure by controlling the air temperature in each polishing zone of the polishing head. Further, since the polishing rate increases with increases in air temperature, less slurry is used—which in turn reduces the use of consumables and the CMP cost.

In some embodiments, a CMP system includes a polishing tool with one or more polishers. Each of the one or more polishers includes a polishing pad; a polishing head, having one or more air chambers, and configured to hold a wafer against the polishing pad; and a slurry dispenser configured to dispense slurry on the polishing pad. The CMP system further includes one or more temperature modules coupled to the polishing head of each of the one or more polishers and configured to supply the one or more air chambers of the polishing head with temperature-controlled air.

In some embodiments, a method includes loading a wafer from a wafer transfer module to a polishing head with one or more air chambers and supplying pressurized air to a temperature module that is coupled to the polishing head and is configured to adjust a temperature of the pressurized air. The method further includes filling the one or more air chambers with the pressurized air from the temperature module and polishing the wafer by rotating the wafer against a polishing pad.

In some embodiments, a method includes transferring a wafer to a polishing tool with a polishing head that is configured to hold the wafer against a polishing pad, where the polishing head includes a first polishing zone and a second polishing zone with each of the first and second polishing zones having air chambers configured to receive temperature-controlled air. The method further includes supplying a first temperature-controlled air with a first temperature to the first polishing zone; supplying a second temperature-controlled air with a second temperature, different from the first temperature, to the second polishing zone. The method also includes dispensing slurry on the polishing pad, and spinning the wafer with the polishing head against the polishing pad to polish the wafer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical planarization (CMP) system, comprising:
   a polishing tool with one or more polishers, wherein each of the one or more polishers comprises:
      a polishing pad;
      a polishing head configured to hold a wafer against the polishing pad, wherein the polishing head comprises a plurality of air chambers, and wherein each air chamber in the plurality of air chambers is configured to receive air at a different temperature; and
      a slurry dispenser configured to dispense slurry on the polishing pad; and
   one or more temperature modules coupled to the polishing head and configured to supply each air chamber in the plurality of air chambers with the air at the different temperature.

2. The CMP system of claim 1, wherein each of the one or more temperature modules comprises a vortex tube, an air heater, or an air cooler.

3. The CMP system of claim 1, wherein the different temperature is selected from a range between about −50° C. and about 130° C.

4. The CMP system of claim 1, wherein the one or more temperature modules are configured to supply a first air chamber in the plurality of air chambers with the air at a first temperature and a second air chamber in the plurality of air chambers with the air at a second temperature lower than the first temperature.

5. The CMP system of claim 1, wherein the one or more temperature modules are configured to change a temperature of the air from 24° C. to a range between about −50° C. and about 23° C. or to a range between about 25° C. and about 130° C.

6. The CMP system of claim 1, wherein the polishing head further comprises a membrane interposed between the plurality of air chambers and the wafer, wherein each air chamber in the plurality of air chambers is configured to exert a downforce on the wafer.

7. The CMP system claim 1, wherein the one or more temperature modules are configured to receive the air from an air supply unit at a first temperature and to change the first temperature to a second temperature different from the first temperature.

8. A method, comprising:
   loading a wafer to a polishing head, wherein the polishing head comprises a plurality of air chambers arranged in a pattern of concentric circles;
   supplying pressurized air to a temperature module coupled to the polishing head, wherein the temperature module is configured to adjust a temperature of the pressurized air so that each air chamber in the plurality of air chambers receives the pressurized air at a temperature different from one another;
   supplying each air chamber in the plurality of air chambers with the pressurized air from the temperature module to independently regulate temperatures of a plurality of wafer regions in contact with the plurality of air chambers; and
   polishing the wafer by rotating the wafer against a polishing pad.

9. The method of claim 8, wherein the temperature of the pressurized air adjusted by the temperature module ranges from about −50° C. to about 130° C.

10. The method of claim 8, wherein polishing the wafer comprises adjusting, during the polishing, the temperature of the pressurized air in each air chamber in the plurality of air chambers.

11. The method of claim 8, wherein polishing the wafer comprises increasing a polishing rate of the wafer in response to increasing the temperature of the pressurized air in one or more air chambers in the plurality of chambers.

12. The method of claim 8, wherein polishing the wafer comprises decreasing a polishing rate of the wafer in response to decreasing the temperature of the pressurized air in one or more air chambers in the plurality of air chambers.

13. The method of claim 8, wherein polishing the wafer comprises adjusting, during the polishing, the temperature and a pressure of the pressurized air in each air chamber in the plurality of air chambers.

14. The method of claim 8, wherein supplying the pressurized air comprises supplying the pressurized air to the temperature module at a temperature of about 24° C.

15. The method of claim 8, wherein the temperature of the pressurized air adjusted by the temperature module in each air chamber in the plurality of chambers controls a polishing rate of the wafer during polishing.

16. A method for polishing a wafer, comprising:
   transferring a wafer to a polishing tool with a polishing head configured to hold the wafer against a polishing pad, wherein the polishing head comprises a first polishing zone and a second polishing zone, each of the first and second polishing zones comprising air chambers configured to receive temperature-controlled air from respective first and second temperature modules;
   supplying a first temperature-controlled air at a first temperature, from the first temperature module, to the first polishing zone and a second temperature-controlled air at a second temperature, from the second temperature module, to the second polishing zone, wherein the first and second temperatures are different;
   dispensing a slurry on the polishing pad; and
   spinning the wafer with the polishing head against the polishing pad to polish the wafer.

17. The method of claim 16, further comprising monitoring, by temperature sensors in the air chambers of the first and second polishing zones, the first and second temperatures.

18. The method of claim 16, wherein spinning the wafer comprises polishing the wafer at a rate controlled at least in part by the first and second temperatures.

19. The method of claim 16, wherein supplying the first and second temperature-controlled air at the first and second temperatures, respectively, comprises setting each of the first and second temperatures between about −50° C. and about 130° C.

20. The method of claim 16, wherein supplying each of the first and second temperature-controlled air comprises pressurizing each of the first and second polishing zones to an equal or different pressure.

* * * * *